United States Patent [19]
Sato et al.

[11] Patent Number: 5,527,649
[45] Date of Patent: Jun. 18, 1996

[54] METHOD FOR FORMING A SUBSTRATE HAVING A LIGHT SHIELDING LAYER

[75] Inventors: Haruyoshi Sato, Kawasaki; Toru Nakamura, Yokohama; Hitoshi Yuasa, Yokohama; Yutaka Otsuki, Yokohama; Hiroyoshi Omika, Yokohama; Norikatsu Ono, Narashino; Tadafumi Shindo, Tokyo, all of Japan

[73] Assignees: Nippon Oil Co., Ltd.; Dai Nippon Priting Co., Ltd., both of Tokyo, Japan

[21] Appl. No.: 249,754

[22] Filed: May 26, 1994

[30] Foreign Application Priority Data

May 28, 1993 [JP] Japan ................................ 5-127588
May 9, 1994 [JP] Japan ................................ 6-095275

[51] Int. Cl.⁶ ........................................ G02F 1/1335
[52] U.S. Cl. .............................. 430/7; 430/20; 430/321
[58] Field of Search .............................. 430/321, 5, 7, 430/20

[56] References Cited

U.S. PATENT DOCUMENTS 4,902,592  2/1990  Matsumura et al. ............... 430/7
5,142,391  8/1992  Fujiwara et al. ................... 359/67
5,186,801  2/1993  Matsumura et al. ............ 204/181.1
5,372,902  12/1994  Yamashita et al. ................ 430/7

*Primary Examiner*—Charles L. Bowers, Jr.
*Assistant Examiner*—John A. McPherson
*Attorney, Agent, or Firm*—Darby & Darby

[57] ABSTRACT

A method for preparing a substrate having a light-shielding layer involves forming a photosensitive coating film on a transparent electrically conductive layer formed on a transparent substrate, exposing the photosensitive coating film via a mask exhibiting light transmitting properties, removing and developing the coating film for exposing the transparent electrically conductive layer and electrodepositing a dark-hued coating on the exposed transparent electrically conductive layer for forming the light-shielding layer, and heating the light-shielding layer. The substrate having the light-shielding layer has a volume resistivity of $1 \times 10^2$ ohm·cm or higher and may be used for a counterelectrode substrate for a TFT array substrate incorporated in a liquid crystal display device.

14 Claims, 1 Drawing Sheet

METHOD FOR FORMING A SUBSTRATE HAVING A LIGHT SHIELDING LAYER

BACKGROUND OF THE INVENTION

This invention relates to a method for forming a substrate having high definition and high light-shielding capability. More particularly, it relates to a method for forming a substrate which has a light-shielding layer and which may be utilized for preparing a color filter employed in particular for a liquid crystal display device, and to a substrate having the light-shielding layer.

This invention also relates to a counterelectrode substrate for a thin film transistor (referred to as TFT) array substrate for black and white display which is superior in high definition and light-shielding capability and which may be prepared by a simple process, and to a liquid crystal display device for black and white display (LCD).

As a typical example of the color liquid crystal display device, there has hitherto been known a TFT (thin film transistor)—active matrix color liquid crystal device. The device includes a substrate arranged on an inner polarizing plate, a thin film transistor (TFT) and a pixel electrode driven by the TFT arranged on the substrate, and an inner alignment layer contacted with both the TFT and the pixel electrode. On its outer side, the device includes a liquid crystal layer having an outer alignment layer and an outer polarizing plate arranged on the outermost side. Between the outer alignment layer and the outer polarizing plate, there is mounted a color filter having a black light-shielding layer (black matrix) and colored layers, such as red-hued layer, green-hued layer and blue-hued layer on a transparent electrically conductive layer formed on the transparent substrate. For producing the color filter, there are currently proposed a dyeing method, a dye-pigment dispersion method, a printing method, an electrodeposition method and a transfer method. With any of these known methods, the precision in the arraying of the respective colored layers, such as red-hued, green-hued and blue-hued layers, herein occasionally abbreviated to R, G, B and BL layers, respectively, is of utmost importance. Above all, the black-hued layer, that is the light-shielding layer, needs to be positioned not only in registry with the counterelectrode substrate to avoid light leakage in the vicinity of the pixel electrode but also without voids between the other colored layers and the light-shielding layer significantly influences the picture quality such as contrast. Consequently, the current practice is to produce the light-shielding layer with high precision and to form other colored layers so as to be overlapped to some extent with the light-shielding layer. For example, an evaporated film of metal such as chromium is patterned using a photolithographic technique to produce a black matrix and the color layers of R, G and B layers are formed with small amounts of overlap with the black matrix at the boundary regions thereof.

With the thin film transistor (TFT) display device for black and white display, which has a construction similar to the above-mentioned color liquid crystal display device, a transparent substrate formed with a light-shielding layer (black matrix) is provided in place of the R, G, and B layers of a color filter, and functions as a counterelectrode substrate. In preparing the counterelectrode substrate, a resist is coated on a metal chromium layer formed by sputtering on a glass substrate, and a black matrix is formed by light exposure, development, etching and film exfoliation. A transparent ITO film is subsequently formed by sputtering on the entire surface.

However, if a light-shielding layer is formed of metal, manufacture-related problems are presented in that the evaporation method or lithography is susceptible to pinholes and involves a complicated process, and that the light-shielding film formed of metal has high light reflectance and leads to inferior viewing properties of the display device. Above all, with the TFT black and white display device, the vacuum process needs to be carried out twice in order to produce the black matrix and the electrode. If the method of overlapping the boundary regions of the colored layers is employed for the preparation of the color filter, it is not possible to produce a color filter having superior surface planarity which is strongly desired when the color filter is used for the color liquid crystal display device.

In order to overcome these problems, a method of employing a photosensitive resin composition admixed with pigments of black or the like dark or thick colors has been proposed in the Japanese Laid-Open Patent Publications Nos. 63-314501, 1-293306 and 5-34514. Specifically, a method of forming a photosensitive resin composition previously colored in a dark color on a transparent substrate, exposing via a pattern mask only the portions of the resin composition required as a light-shielding layer, for curing the resin composition and developing and removing only the unexposed portions of the resin composition, a method of forming a layer of a photosensitive resin composition previously colored to have a thick color on a substrate on which R, G and B layers have been formed, exposing the reverse substrate surface, that is the substrate surface not having the layer of the photosensitive resin composition, to light for curing the photosensitive resin composition and developing and removing only the unexposed portion, and a combination of these methods, are disclosed. However, the photosensitive resin composition colored to have a dark color hue exhibits high light absorption so that curing cannot proceed to a sufficient depth on exposure to light. Consequently, the photosensitive resin composition colored to have a thick hue tends to be removed during removal by development so that the light-shielding layer having a high light-shielding capability can hardly be produced. In addition, the photosensitive resin composition having its exposed portion cured by photopolymerization is frequently employed. In light exposure in atmospheric air, curing is obstructed significantly by oxygen contained in atmospheric air, such that complex preventative measures such as provision of an oxygen interrupting film or employing an atmosphere free of oxygen, such as vacuum or an argon atmosphere, are needed in carrying out the light exposure. Although it may be envisaged to eliminate such cumbersome operations by increasing the amount of light exposure to an extreme degree, reflection, scattering or leakage of light is increased, while the substrate temperature tends to be raised, thus presenting difficulties in the formation of the high-precision light-shielding layer.

On the other hand, if the photosensitive resin composition containing black-hued or nearly black-hued pigment is employed as a black matrix for a counterelectrode substrate for a TFT array substrate, and a transparent substrate having a transparent electrode is employed as a counterelectrode substrate, it is necessary to provide a transparent electrode by sputtering on the overall surface, because the black matrix itself lacks electrical conductivity. The reason is that, if the liquid crystal on the black matrix is not responsive to electrical voltage, the liquid crystal portion in the vicinity of pixels undergoes light leakage during voltage-on time with the normally white system employed in the TFT array system, thus lowering the contrast.

SUMMARY OF THE INVENTION

It is an object of the present invention to provide a method for forming a substrate having a light-shielding layer by which the light-shielding layer having superior definition and light-shielding properties may be easily formed with sufficient accuracy, and which may be particularly useful for forming a color filter, and a substrate having such light-shielding layer.

It is another object of the present invention to provide a method for forming a substrate having a light-shielding layer whereby the light-shielding layer having superior definition and light-shielding properties as well as low reflectance and electrical conductivity may be easily formed with sufficient accuracy by employing specified carbon black as the pigment.

It is a further object of the present invention to provide a counterelectrode substrate for a TFT array substrate for black and white display which is superior in definition and light-shielding properties and which may be formed by a simplified process, and a liquid crystal display device (LCD) for black and white display employing the counterelectrode substrate.

According to the present invention, there is provided a method for preparing a substrate having a light-shielding layer comprising the steps of i) forming a positive photosensitive coating film on a transparent electrically conductive layer formed on a transparent substrate, ii) exposing the positive photosensitive coating film via a mask exhibiting light transmitting properties only at portions thereof registering with the light-shielding layers iii) removing and developing the portions of the coating film exposed to light for exposing the transparent electrically conductive layer and electrodepositing a dark-hued coating on at least a portion of the exposed transparent electrically conductive layer for forming the light-shielding layer, and iv) heating the light-shielding layer.

According to the present invention, there is also provided a method for preparing a substrate having a light-shielding layer comprising the steps of i) forming a negative photosensitive coating film on a transparent electrically conductive layer formed on a transparent substrate, ii) exposing the negative photosensitive coating film via a mask exhibiting light transmitting properties only at portions thereof other than those registering with the light-shielding layer, iii) removing and developing the portions of the coating film not exposed to light for exposing the transparent electrically conductive layer and electrodepositing a dark-hued coating on at least the exposed transparent electrically conductive layer for forming the light-shielding layer, and iv) heating the light-shielding layer.

According to the present invention, there is also provided a substrate having a light-shielding layer comprising a transparent substrate, a transparent electrically conductive layer formed on the transparent substrate and a light-shielding layer formed on the transparent electrically conductive layer, wherein the light-shielding layer contains carbon black having a maximum particle size of 1 µm or less dispersed within a polymer matrix and wherein the light-shielding layer has a volume resistivity of $1 \times 10^2$ ohm·cm or higher.

According to the present invention, there is provided a liquid crystal display device for black and white display comprising a first polarizing plate, a substrate arranged on the first polarizing plate, a thin film transistor, and a pixel electrode driven by the thin film transistor, the thin film transistor and the pixel electrode both being formed on an outer surface of the substrate opposite to the first polarizing plate, an inner alignment layer in contact with the thin film transistor and the pixel electrode, a liquid crystal layer being in contact with the inner alignment layer and having an outer alignment layer on its opposite side surface, a second polarizing plate arranged on an outermost side surface of the display device and a counterelectrode substrate arranged between the outer alignment layer and the second polarizing plate, the counterelectrode substrate having a transparent substrate in contact with the second polarizing plate and a transparent electrically conductive layer electrodeposited on the other side of the transparent substrate, a light-shielding layer of a dark-hued colored layer formed on the electrically conductive layer being contacted with the outer alignment layer.

BRIEF DESCRIPTION OF THE DRAWING

The sole figure is a schematic cross-sectional view for a black and white liquid crystal display device according to the present invention.

DESCRIPTION OF THE INVENTION

Figure 1:
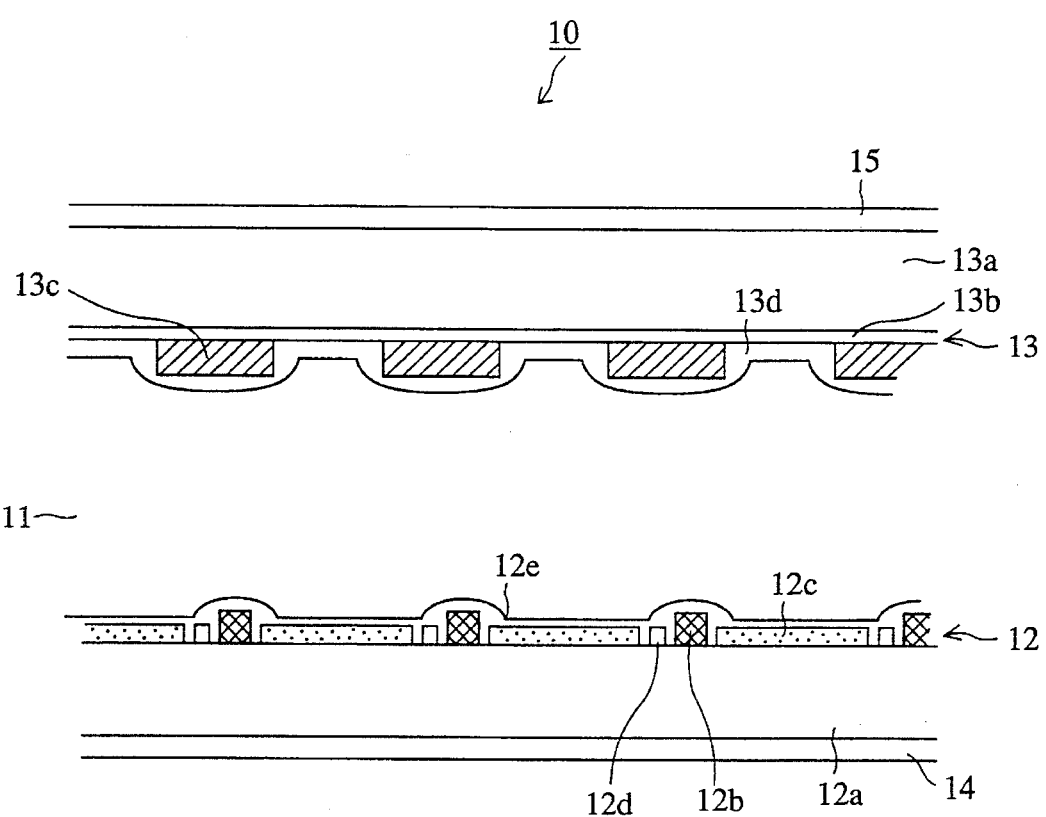

The present invention will be explained in detail hereinbelow.

With the method of the present invention, the step of forming a positive photosensitive coating film on a transparent electrically conductive layer (transparent electrode) on the transparent substrate, referred to hereinafter as a step 1-A, is first performed. Alternatively, with the method of the present invention, the step of forming a negative photosensitive coating film on a transparent electrically conductive layer on the transparent substrate, referred to hereinafter as a step 1-B, is first performed.

There is no limitation to the materials of the transparent substrate, provided that it is transparent and plate-shaped. Specifically, these materials may include quartz, various glasses, various transparent resins (plastics), such as polyester, polyphenylene sulfide, epoxy resins, acrylic resins, polymethylpentene, polyimides, polycarbonates, polyamides, polysulfone, polyether, polystyrene, acrylonitrile-styrene copolymers or cellulose triacetate. In view of the properties desired of the color filter and so forth, as an ultimate product, the surface of the transparent substrate is desirably smooth and occasionally ground before use.

The transparent electrically conductive layer formed on the transparent substrate is preferably formed of tin oxide, indium oxide, indium-tin oxide or antimony oxide, and usually has a film thickness of 20 to 300 nm. The transparent electrically conductive layer may be formed by spraying, chemical vapor deposition (CVD), sputtering or vacuum evaporation.

There is no particular limitation to the photoresist forming the positive photosensitive coating film, provided that the light exposed portion is soluble in a developing solution and thereby removed. The photoresist may be enumerated by compounds containing quinone diazido groups, compounds having diazomeldrum's acid or nitrobenzyl esters, a composition containing these compounds, and chemically amplified compositions employing a compound generating an acid by light (acid-generating agent by light). More specific examples include a composition prepared by suitably mixing with a resin having a film-forming function a reaction product between a compound having a hydroxyl group and a quinone diazidosulfonic acid derivative or a quinonediazido compound having an isocyanate group. There is no limitation to the mixing ratio which may be suitably selected depending on conditions of the light exposure and development. Examples of the photoresist may further include chemically amplified compositions composed of a resin having a quinonediazido group or a composition containing a resin having a quinonediazido group, an acid-generating agent by light selected from aryl sulfonium salts, aryl iodonium slats, halomethyl triazine, esters of sulfonic acid and tosylates having an o-nitrobenzyl group, and polyhydroxystyrene having a t-butoxycarbonyl group or a tetrahydropyranyl group introduced therein. Various commercially available positive photoresists may also be employed.

There is no limitation to the photoresist forming the negative photosensitive coating film, provided that the light exposed portion thereof is not removed by a developing solution and only the unexposed portion thereof is insoluble in the developing solution. For example, a prepolymer or a resin having the molecular weight ranging in general between 500 and 10,000 and containing an ethylenic double bond capable of being cross-linked by light, such as (meth)acryloyl group, e.g. acryloyl or methacryloyl group, and/or cinnamoyl group, in its molecule, which prepolymer or resin may be dissolved or dispersed in water along with a photopolymerization initiator and occasionally with a dye and/or a pigment.

The prepolymer or the resin may be enumerated by the prepolymers, such as epoxy (meth)acrylate, urethane (meth)acrylate or polyester (meth)acrylate; cationic resins which are produced by introducing onium groups, such as amino groups, ammonium or sulfonium and the above-mentioned photosensitive groups into acrylic resins, epoxy resins, urethane resins or polybutadiene resins and which are dissolved and/or dispersed in an organic solvent or solubilized and/or dispersed in water with acids such as formic acid, acetic acid, propionic acid or lactic acid or with acidic substances; and anionic resins which are produced by introducing carboxyl groups and the above-mentioned photosensitive groups into acrylic resins, polyester resins, maleinated oil resins, polybutadiene resins or epoxy resins, and which are dissolved and/or dispersed in an organic solvent or solubilized and/or dispersed in water with basic substances such as triethylamine, diethylamine or ammonia. Prepolymers or resins capable of being solubilized and/or dispersed in water are especially preferred for simplifying the process or preventing environmental pollution.

Low molecular (meth)acrylates may be added to the negative photosensitive coating material for adjusting the viscosity and photosensitivity of the coating film. These (meth)acrylates may be enumerated by 2-hydroxyethyl (meth)acrylate, 2-phenoxyethyl (meth)acrylate, 3-phenoxy-2-hydroxypropyl (meth)acrylate, 2-ethylhexyl (meth)acrylate, tricyclodecane (meth)acrylate, hexanediol di(meth)acrylate, trimethylolpropane triacrylate, pentaerythritol triacrylate, dipentaerythritol hexaacrylate and tris(acryloyloxyethyl) isocyanurate. These may also be used in a mixture. The mixing ratio of these (meth)acrylates is preferably 0 to 50 parts by weight and more preferably 0 to 30 parts by weight to 100 parts by weight of the resin for the negative photosensitive coating material. If the mixing ratio exceeds 50 parts by weight, the coating film undesirably tends to be viscid.

As the photopolymerization initiator, any material known in the art may be employed. Examples of the known photopolymerization initiator include benzoin and ethers thereof, benzyl alkyl ketals, benzophenone derivatives, anthraquinone derivatives and thioxanthone derivatives. The photopolymerization initiator may be admixed with a suitable sensitizer if so desired. The photopolymerization initiator is added preferably in an amount of 0.1 to 30 parts by weight and more preferably in an amount of 0.5 to 20 parts by weight to 100 parts by weight of the resin for the negative photosensitive coating material. If the photopolymerization initiator is added in the amount less than 0.1 part by weight, photocurability becomes insufficient. If it exceeds 30 parts by weight, curing proceeds excessively so that the film strength becomes insufficient with economic demerits.

The negative photosensitive coating material may be prepared by a method comprising mixing a resin for the photosensitive coating material, a photopolymerization initiator, an organic solvent and/or water and, if necessary, various assistant agents, such as dyes and/or pigments, acidic or basic substances, dispersion assistant agents for dyes or pigments, levelling agents for improving smoothness of the coating films, viscosity adjustment agents or anti-foaming agents, and sufficiently dispersing the ingredients, using a well-known dispersion means, such as a sand mill or an attriter.

There is no particular limitation to the organic solvents employed for dispersing or dissolving the above-mentioned positive or negative photoresists or compositions thereof capable of forming the photosensitive coating films. Examples of the solvents may include glycolethers, such as ethylene glycol monobutylether, ethylene glycol monohexylether, ethylene glycol monophenylether, propylene glycol monomethyl ether, propylene glycol monophenylether, diethylene glycol dimethylether or triethylene glycol dimethylether; ketones, such as acetone, methylethyl ketone, methylisobutyl ketone, cyclohexanone, isophorone, or N-methyl pyrrolidone; ethers, such as dibutyl ether, dioxane, or tetrahydrofuran; alcohols, such as methoxybutanol, diacetone alcohol, octanol, butanol, or isopropanol; hydrocarbons, such as toluene, xylene, cyclohexane or hexane; esters, such as ethyl acetate, butyl acetate, 2-methoxy ethyl acetate, 2-methoxy propyl acetate or ethyl benzoate; and acid amides, such as dimethyl formamide, N,N-dimethyl acetamide or dimethyl sulfoxide. These organic solvents may be used alone or in combination.

The positive photosensitive coating film or the negative photosensitive coating film may be formed on the transparent electrically conductive layer by any known methods, such as immersion, spraying, spin coating, roll coating, screen printing or electrodeposition.

There is no particular limitation to the film thickness of the photosensitive coating film, which may be suitably selected depending on the properties required of the color filter as the ultimate product. Above all, in relation to the shape of the light-shielding layer, it is desirable for the film thickness of the photosensitive coating film to be usually 0.5 to 20 times and preferably 1 to 10 times that of the light-shielding layer. If the film thickness of the photosensitive coating film is less than the above range, there may be a large possibility that the thick-colored layer which is to form the light-shielding layer by electrodeposition during the next step is formed on the photosensitive coating film, or the light-shielding layer is formed which has a line width broader than that of the pattern prescribed by the photosensitive coating film. If the film thickness of the photosensitive coating film is larger than the above range, there may be a high possibility that problems are presented in the resolution of the photosensitive coating film or the electrodeposition or the coating material for electrodeposition can hardly enter the opening during electrodeposition so that the light-shielding layer cannot be formed in a desired manner.

For adjusting the film thickness, the coating conditions may suitably be selected depending on the particular coating method. In the case of spin coatings for example the film thickness can easily be controlled by adjusting the viscosity of the coating liquid or the number of revolutions of a spinner, while in case of electrodeposition, for example the conditions of electrodeposition such as coating voltage, electrodeposition time or liquid temperature may be changed to adjust the film thickness.

In the method of the present invention, the positive photosensitive coating film is exposed to light via a mask exhibiting light-transmitting properties only at portions thereof registering with the light-shielding layer. The process step is referred to hereinafter as a step (2-a). Alternatively, the negative photosensitive coating film is exposed to light via a mask exhibiting light-transmitting properties only at portions thereof other than those registering with the light-shielding layer. The process step is referred to hereinafter as a step (2-b).

The mask exhibiting light transmitting properties at the portions thereof registering with the light-shielding layer, or the mask exhibiting light transmitting properties at the portions thereof other than those registering with the light-shielding layer, is a photomask usually employed in photolithography, and needs only to be patterned to have a desired shape.

The light exposure may be effected using a light source capable of generating a large quantity of ultraviolet rays, such as a high-pressure mercury lamp, an ultra-high pressure mercury lamp, xenon lamp, a metal halide lamp, an excimer laser or a synchrotron light radiator. If necessary, a radiation source other than the ultraviolet ray generator may be employed. The light exposure conditions may be suitably selected depending on the photosensitive coating film, the method or the apparatus for light exposure. For example, there is no particular limitation to the amount of light exposure which may be suitably selected depending on the light source or the photosensitive coating film. The amount of light exposure is usually 0.1 to 1000 mJ/cm$^2$ and preferably 5 to 500 mJ/cm$^2$.

With the method of the present invention, when the positive photosensitive coating film is employed, the portions of the coating film exposed to light are removed and developed for laying or exposing the transparent electrically conductive layer to the outside, and a dark-hued coating is electrodeposited on at least the exposed transparent electrically conductive layer said to the outside for forming the light-shielding layer. The above process step is referred to hereinafter as the step (3-a). With the method of the present invention, when the negative photosensitive coating film is employed, the portions of the coating film not exposed to light are removed and developed for laying or exposing the transparent electrically conductive layer to the outside, and a dark-hued coating is electrodeposited on at least the exposed transparent electrically conductive layer laid to the outside for forming the light-shielding layer. The above process step is referred to hereinafter as the step (3-b).

There is no particular limitation to the development conditions in the steps (3-a) or (3-b) and any conditions may be suitably employed depending on the amount of light exposure in the steps (2-a) or (2-b), solubility of the photosensitive coating film in the developing solution, the kind or the concentration of the developing solution, the developing time or developing temperature. There is no particular limitation to the developing solution if it is capable of :removing the exposed or unexposed portions of the photosensitive coating film of the step (3-a) or (3-b) by development, such that the developing solution may be suitably selected depending on the types or the light exposed state of the photosensitive coating film.

In the step (3-a), an aqueous solution of a basic substance is usually employed as the developing solution. Examples of the basic substance include sodium carbonate, sodium hydrogen carbonate, sodium metasilicate, tetraalkyl ammonium hydroxide, such as tetramethyl ammonium hydroxide, sodium hydroxide, potassium hydroxide or ammonia. For the developing solution, an organic solvent, such as alcohols, glycol ethers, ketones, hydrocarbons or chlorinated hydrocarbons, may be employed either as a mixture or in combination with the above-mentioned aqueous developing solutions. Of these, the aqueous developing solution is preferred.

If a cationic resin is used as an ingredient of the photosensitive coating material, the developing solution employed in the step (3-b) may be an aqueous solution containing an acidic substance dissolved therein. The acidic substance may be enumerated by organic acids, such as formic acid, acetic acid, propionic acid or lactic acid, and inorganic acids, such as hydrochloric acid or phosphoric acid. If an anionic resin is used as an ingredient of the negative photosensitive coating material, a developing solution containing a basic substance dissolved in water may be employed. The basic substance includes sodium carbonate, sodium hydrogen carbonate, sodium metasilicate, tetraalkylammonium hydroxide, sodium hydroxide and potassium hydroxide. As the developing solution, an organic solvent, such as alcohols, glycol ethers, glycols, ketones, hydrocarbons or chlorinated hydrocarbons may be employed, either as a mixture or in combination with the aqueous developing solution. The developing solution may be admixed with surfactants or anti-foaming agents for improving wettability or anti-foaming properties. An aqueous developing solution is preferably employed in view of toxicity or working environments.

If the aqueous solution of tetramethyl ammonium hydroxide is used in the step (3-a) for the developing solution, the developing conditions may be suitably selected from the concentration of 0.01 to 20 wt %, and preferably 0.05 to 10 wt %, the temperature of 10° to 80° C. and preferably 15 to 40° C., the developing time of 2 to 600 seconds and preferably 4 to 300 seconds.

If an aqueous solution of sodium carbonate is used as the developing solution in the step (3-b), the concentration of sodium carbonate may usually be in a range of 0.01 to 25 wt % and preferably in a range of 0.05 to 15 wt %, the temperature may be in a range of 10° to 70° C., and the developing time may be suitably selected from a range of 5 to 600 seconds and preferably from a range of from 5 to 300 seconds. If an aqueous solution of lactic acid is used in the step (3-b), the concentration of lactic acid may usually be in a range of 0.01 to 50 wt % and preferably in a range of 0.05 to 25 wt %, the temperature may be in a range of 10° to 70° C. and preferably in a range of 15° to 50° C., and the developing time may be suitably selected from a range of 2 to 600 seconds and preferably from a range of from 4 to 400 seconds.

The dark-hued colored coating material employed in the step (3-a) or (3-b) may be exemplified by a water-soluble or -dispersible coating material containing (a) a dye and/or a pigment having a thick hue, such as black, thick indigo or thick brown, (b) a binder resin for electrodeposition and occasionally (c) a curing agent.

The dye and/or pigment may be exemplified by, for example, carbon black, graphite, vanadium trioxide, manganese dioxide, molybdenum disulfide, triiron tetraoxide, Aniline Black, Sudan Black B, Acid Black 1 and 52, Fast Black K Salt, Nigrosin or mixtures thereof. The dyes and/or pigments shown in detail in "COLOR INDEX", third issue, may also be employed.

If the substrate having the light-shielding layer formed by the method of the present invention is employed as the black matrix for the color filter, there is no particular limitation to the dyes and/or the pigments and any dyes and/or pigments enumerated above may be employed. If the substrate having the light-shielding layer formed by the method of the present invention is employed as the light-shielding layer for the counterelectrode substrate for a TFT array substrate for black and white display, there is also no particular limitation to the dye and/or pigment contained therein and any of the above-enumerated dyes and/or pigments may be employed. Of these, however, the pigments, above all, those in the form of electrically conductive fine particles, are particularly preferred. As the electrically conductive fine particles, at least one of carbon black, metal oxides, such as tin oxide, ITO, indium oxide, titanium oxide, ruthenium oxide, or vanadium oxide, and metals, such as gold, platinum, palladium, silver alloys, copper or nickel, may preferably be employed. Needless to say, two or more of these components may be used as a mixture in order to strike a balance between light-shielding properties and electrical conductivity. It is preferred for the substrate having the light-shielding properties of the present invention to have the volume resistivity of $1 \times 10^2$ ohm·cm or higher and above all the volume resistivity of $1 \times 10^2$ to $1 \times 10^{12}$ ohm·cm and the surface resistivity of $1 \times 10^2$ to $1 \times 10^{14}$ ohm/$\square$. If the volume resistivity is lower than $1 \times 10^2$ ohm·cm, the dye and/or the pigment tends to be raised in concentration such that a film having satisfactory physical properties, and above all high adherence cannot be produced. If the volume resistivity is higher than $1 \times 10^{12}$ ohm·cm, the dye and/or the pigment tends to have low concentration, thus leading to insufficient light-shielding properties. Similarly, if the surface resistivity is lower than $1 \times 10^2$ ohm/$\square$, the dye and/or the pigment tends to be raised in concentration and hence poor in adherence, whereas, if the surface resistivity is higher than $1 \times 10^{14}$ ohm/$\square$, sufficient light-shielding properties occasionally cannot be achieved.

If the black matrix portion of the light-shielding layer is used as a counterelectrode substrate for a TFT array substrate for black and white display, light modulation due to the liquid crystal orientation on the black matrix has the effect of preventing light leakage, so that higher electrical conductivity of the black matrix portion, that is the light-shielding portion, is desired. Specifically, the volume resistivity of $1 \times 10^2$ to $1 \times 10^9$ ohm·cm and preferably $1 \times 10^2$ to $1 \times 10^6$ ohm·cm and the surface resistivity of $1 \times 10^2$ to $1 \times 10^9$ ohm/$\square$ and preferably $1 \times 10^2$ to $1 \times 10^6$ ohm/$\square$ is desired. If the volume resistivity is lower than $1 \times 10^2$ ohm·cm, the electrically conductive fine particles usually need to be used in a higher concentration, which leads undesirably to inferior adhesivity of the light-shielding layer to the ITO substrate. If the volume resistivity is larger than $1 \times 10^9$ ohm·cm, the liquid crystal display device becomes undesirably inferior in viewing properties. If the surface resistivity is lower than $1 \times 10^2$ ohm/$\square$, the electrically conductive fine particles usually need to be used in a higher concentration, which leads undesirably to inferior adhesivity of the light-shielding layer to the ITO substrate. If the surface resistivity is larger than $1 \times 10^9$/$\square$, the liquid crystal display device may lack viewing properties. The lowering of viewing properties is due to the fact that the liquid crystal in contact with the light-shielding layer is not responsive to the voltage application. That is, the TFT-LCD is usually employed with normally white so that the light polarized by the polarizing plate undergoes birefringence at the liquid crystal in contact with the light-shielding layer, thus undesirably leading to light leakage in the vicinity of the pixels and hence to lowered contrast and inferior viewability of the liquid crystal display device. Accordingly, in the black matrix of the present invention, it is not necessary to further form an ITO relative to the black matrix.

If, on the other hand, the black matrix is used as the light-shielding layer of the color filter for the liquid crystal display device manufactured by the electrodeposition method, it is preferred for the black matrix portion to have low electrical conductivity in order to prevent the occurrence of the phenomenon of electrodeposition of the electrodeposited layers of, for example, R, G and B on the black matrix portion.

Specifically, it is desirable for the black matrix portion of the light-shielding layer to have the volume resistivity of $1 \times 10^6$ to $1 \times 10^{12}$ ohm·cm and the surface resistivity of $1 \times 10^4$ ohm/$\square$ to $1 \times 10^{14}$ ohm/$\square$. If the volume resistivity is lower than $1 \times 10^6$ ohm·cm, the phenomenon of over-coating, that is the phenomenon of the colored coating material being electrodeposited on the light-shielding layer undesirably tends to be produced. Above the volume resistivity of $1 \times 10^{12}$ ohm·cm, light-shielding properties are extremely lowered, thus leading to lowered contrast of the color filter and lowered protective characteristics of TFT. Below the surface resistivity of $1 \times 10^4$ ohm/$\square$, the phenomenon where the colored coating material may be electrodeposited on the light-shielding layer (over-coating) may occur. If the surface resistivity is higher than $1 \times 10^{14}$ ohm/$\square$, the light-shielding properties are significantly lowered, so that characteristics of the color filter, such as contrast, or protective characteristics of the TFT, are undesirably lowered.

Of the above pigments, carbon black is preferred because it exhibits high light-shielding properties even if used in small quantities. In view of light-shielding properties and stability of the electrodeposition coating material, it is necessary for the carbon black to have the maximum particle size of not larger than 1 μm. As for the maximum particle size of the carbon black on dispersion thereof, as measured by the light-scattering particle size distribution measurement device manufactured by OTSUKA ELECTRONICS CO., LTD. under the trade name of "PAR-III", the number average particle size (dn) is desirably not more than 1 μm and more desirably not more than 0.5 μm, while the weight average particle size (dr)/number average particle size (dn) is desirably not more than 2.5. It is more preferred for dn and the ratio dv/dn to be not more than 0.3 Nm and not more than 2, respectively. If the maximum particle size exceeds 1 μm, the electrodeposition coating material tends to be inferior in stability, while the resulting light-shielding layer tends to be inferior in smoothness or definition. The maximum particle size of not more than 1 μm is desirable because the electrical conductivity of the light-shielding layer becomes more readily controllable by suitably selecting the pigment/binder resin mixing ratio or the heat treatment conditions as later explained.

In general, if the electrically conductive material, such as carbon black, is used as a pigment in a dark-hued coating material, the dark-hued layer exhibits electrical conductivity. It is possible with the present invention to increase the electrical conductivity of the dark-hued layer to such an extent that the light-shielding layer can be utilized as the counterelectrode for a TFT array substrate, or to decrease the electrical conductivity of the dark-hued layer to such an extent that the light-shielding layer can be satisfactorily employed as a light-shielding layer for the color filter manufactured by the electrodeposition method. The black-hued black matrix exhibiting high light-shielding properties may be produced if the above-mentioned dye and/or the pigment is used in an amount usually of 2 to 300 parts by weight and preferably 3 to 100 parts by weight to 100 parts by weight of the electrodeposition binder resin.

If carbon black is employed as the pigment, it is possible to accord stability and reliability to the light-shielding layer on curing by heating and hence to produce the black-hued black matrix exhibiting light-shielding properties by employing usually 10 to 80 parts by weight and preferably 20 to 60 parts by weight of the carbon black to 100 parts by weight of the electrodeposition binder resin. The black matrix in which carbon black is dispersed in this manner in the polymer matrix exhibits light reflectance which is lower than when the black matrix is manufactured by metal sputtering or the like.

For producing a counterelectrode for a TFT array substrate for black and white display using carbon black, the electrically conductive fine particles are preferably added in an amount of 30 to 80 parts by weight to 100 parts by weight of the electrodeposition binder resin. If the particles are added in an amount less than 30 parts by weight, the resulting black matrix is low in light-shielding properties and electrical conductivity, whereas, if the particles are added in an amount exceeding 80 parts by weight, the resulting black matrix is lowered in planarity and definition.

As the above-mentioned electrodeposition binder resin, the resins having groups which become cationic or anionic groups when dissolved and/or dispersed in water may be employed. If a transparent substrate having an ITO transparent electrically conductive layer thereon is used as the substrate for electrodeposition, it is not desirable to perform cationic electrodeposition using a resin containing the groups which become cationic groups, because the ITO layer becomes oxidized by the acid contained in the electrodeposition solution. Thus it is preferred to perform anionic electrodeposition using a resin containing the groups which become anionic groups. If cationic electrodeposition is to be preformed, a substrate which is not oxidized with the acid contained in the electrodeposition solution, such as stainless steel or platinum, needs to be employed, and the light-shielding layer produced by electrodeposition needs to be transferred onto an actually employed transparent substrate, such as glass. As the resins containing cationic groups, those produced by introducing amino groups or onium groups, such as ammonium, sulfonium or phosphonium, into acrylic, epoxy, urethane, polybutadiene of polyamide resins and rendering the resulting material soluble or dispersible in water with acids such as formic acid, acetic aid, propionic acid or lactic acid, or with acidic substances.

The anionic resins may be enumerated by, for example, acrylic resin, polyester resin, maleinated oil resin, polybutadiene resin or epoxy resin containing carboxyl groups and rendered soluble or dispersible in water with basic substances, such as triethylamine, diethylamine, dimethylethanolamine or ammonia. The curing agents, which may be occasionally employed, may be suitably selected in view of suitability of addition thereof to the electrodeposition binder resin employed, and may be enumerated by, for example, melamine, benzoguanamine, urea, or derivatives thereof; amino resins, such as melamine or urea resins; phenolic resins; and blocked isocyanates. Those curing agents which remain effective at lower temperatures are preferably employed. The dark-hued coating material may further be admixed with dispersion assistant agents for dyes or pigments, or various assistant agents, such as levelling agents for improving smoothness of the coating film, viscosity controllers or anti-foaming agents.

The dark-hued coating material may be produced by mixing the dye and/or the pigment, the composition containing the electrodeposition binder and, if necessary, the curing agent, organic solvent, water, acidic substances, basic substances, dispersion assistant agents for the dye or the pigment, levellers, viscosity controllers and the anti-foaming agents, sufficiently dispersing the mixture using commonly employed dispersing means, such as sand mills, roll mills, attriters or ball mills, and diluting the resulting dispersion with water to preferably a pre-set concentration such as approximately 4 to 25 wt % and more preferably 7 to 20 wt % of solid contents to give a coating material suited for electrodeposition. An organic solvent employed for dispersion and dissolution of the resin for the photosensitive coating film may be suitably selected and employed for facilitating the dissolution and/or dispersion of the binder for electrodeposition or improving bath stability or with a view to producing a smooth coating film.

There is no limitation to the thickness of the dark-hued layer, that is the light-shielding layer, formed by electrodeposition coating, such that it may be suitably selected depending on the properties demanded of the color filter or the designing of the display device. In view of light-shielding properties, the dry thickness of the light-shielding layer is usually 0.3 to 5 µm and preferably 1 to 3 µm. The thickness of the light-shielding layer may be selected from one coating material to another because it is varied depending on the kind and the size of the dye and/or pigment employed or the mixing ratio of the electrodeposition binder resin. The film thickness may be controlled by adjusting the conditions of electrodeposition, such as coating voltage, electrodeposition time or liquid temperature.

The conditions of electrodeposition coating for forming the dark-hued layer, such as voltage, electrodeposition time or liquid temperature, may be suitably selected depending on the kind of the dark-hued coating material or the thickness of the desired light-shielding layer. For example, the coating voltage may usually be a dc voltage of 5 to 500 V, preferably 10 to 300 V and more preferably 10 to 150 V, while the electrodeposition time is usually 5 to 300 seconds and preferably 10 to 200 seconds and the liquid temperature is 10° to 35° C. and preferably 15° to 30° C. Preferably, the current supply is discontinued after lapse of the electrodeposition time necessary to obtain the desired film thickness, the substrate is taken out of the bath, freed of any excess bath liquid by washing with water and dried.

With the method of the present invention, the dark-hued coating electrodeposited on the substrate, that is the light-shielding layer, is heated, referred to hereinafter as the step (4).

The heating may be carried out under such conditions as will permit the moisture in the light-shielding layer formed by electrodeposition of the steps (3-a) or (3-b) to be dried easily. If the resin for electrodeposition exhibits heat curability, the curing by heating may be carried out under such condition as will permit cross-linking reaction to be completed depending on the objective. Since the resistance to the developing solution and to alkali of the light-shielding layer may be influenced by, for example, the concentration of the acids contained in the coating film constituting the light-shielding layer, the heat treatment does not solely depend on its conditions.

If the light-shielding layer is not required to exhibit resistance to the developing solution or to alkali, or if the electrical conductivity of the light-shielding layer needs to be as low as possible, the heat treatment may be carried out at a temperature of, for example, not higher than 150° C., preferably 80° to 140° C., usually for 0.5 minute to one hour and preferably for 1 to 30 minutes. By using these conditions, it is possible for the light-shielding layer to have practically acceptable electrical insulating properties, such as the volume resistivity of $1\times10^6$ to $1\times10^{12}$ ohm·cm and the surface resistivity on the order of $1\times10^4$ to $1\times10^{14}$ ohm/□, even although the light-shielding layer is formed of carbon black and in case where colored layers of R, G and B are to be subsequently electrodeposited.

If the light-shielding layer requires to exhibit resistance to the developing solution or to alkali, and if electrical conductivity is to be as high as possible, heating may be carried out at a temperature of, for example, 130° to 270° C., preferably 140° to 250° C., for a time period usually employed for such heating. These conditions for heating may be suitably selected depending on whether the light-shielding layer formed in accordance with the present invention is employed for a black matrix for a color filter or for a black matrix for a counterelectrode for a TFT array substrate for black and white display. That is, when the black matrix for the color filter is formed using carbon black as the pigment and, in succession thereto, the colored layers of red, blue and green hued layers are formed by electrodeposition, it is preferred to carry out the heating under such conditions as will permit the moisture on the surface of the light-shielding layer formed by electrodeposition of the step (3-a) or (3-b) to be dried readily. It is preferred to carry out the curing by heating under such condition as will maintain electrical insulating properties inhibiting the electrodeposition of the colored layer on the black matrix, that is, under the conditions of the temperature of not higher than 180° C. and preferably 80 to 140° C. and the heating time of 2 to 120 minutes. The electrical insulating properties in terms of the volume resistivity of $1\times10^6$ ohm·cm or higher, as stated previously, is desirable. Although the moisture is sufficiently dried with the temperature exceeding 180° C., the volume resistivity becomes less than $1\times10^6$ ohm·cm when the carbon black proportion satisfying the requirements for light-shielding properties is used, so that the colored layer is undesirably formed on the black matrix in the course of the formation of the colored layer by electrodeposition.

If the colored layer is formed by electrodeposition, it is crucial to control the electrical conductivity of the light-shielding layer in order to prevent over-coating of the colored layer. There is no problem when forming the colored layer by the pigment-dispersing method or the printing method, in which cases the heating of the light-shielding layer may be usually at 80° to 270° C. and preferably at 130° to 250° C.

When employing the black matrix of the light-shielding layer for the counterelectrode for a TFT array substrate for black and white display, it is preferred for the black matrix to have the electrical conductivity acceptable in view of the function of the counterelectrode. For example, the heating may be carried out usually at 130° to 350° C., preferably at 140° to 280° C., usually for 5 minutes to 3 hours, preferably for 10 minutes to 1.5 hours. In such case, a light-shielding layer having the volume resistivity on the order of $1\times10^2$ to $1\times10^9$ ohm·cm may be produced. The counterelectrode having such black matrix needs to have some electrical conductivity because the liquid crystal on the black matrix has to be responsive to the voltage application. The electrical properties of the light-shielding layer may be controlled depending on the kind of the electrically conductive fine particles, the mixing ratio of the electrically conductive fine particles to the binder resin for electrodeposition or the conditions of the heating. It suffices if the black matrix after heating exhibits the volume resistivity of $1\times10^2$ to $1\times10^9$ ohm·cm, preferably $1\times10^2$ to $1\times10^6$ ohm·cm.

In addition, the electrical conductivity of the light-shielding layer may be controlled more extensively by selecting not only the conditions of heating but also the proportion of the carbon black in the materials of the light-shielding layer within the above-mentioned range. In this case, it desirably becomes possible to select the volume resistivity in the range of from $1\times10^2$ to $1\times10^{12}$ ohm·cm and the surface resistivity in a range of from $1\times10^2$ to $1\times10^{14}$ ohm/□, as measured at 20° and 60% RH, depending on the usage and application.

The present invention is also directed to a substrate having a light-shielding layer in which the carbon black having the maximum particle size of not more than 1 μm is dispersed in the polymer matrix and in which the light-shielding layer has the volume resistivity of not less than $1\times10^2$ ohm·cm and is formed on the transparent electrically conductive substrate. Although the light-shielding layer is produced most preferably by the above-mentioned method, it may also be produced by a method of forming the light-shielding layer on the patterned transparent electrically conductive substrate by electrodeposition, a method of printing the light-shielding layer on the patterned transparent electrically conductive substrate, or a photolithographic method. Of these, the photolithographic method resides in applying the light-shielding resin composition exhibiting photocurability on a substrate and drying the resin composition followed by light exposure and development.

Referring to the drawings an embodiment of a counterelectrode substrate for a thin film transistor (TFT) array substrate for black and white display, and a liquid crystal display device for black and white display having the counterelectrode substrate incorporated therein, is hereinafter explained.

A liquid crystal display device 10 for black and white display includes a TFT array substrate 12 for black and white display, a counterelectrode substrate 13 and a liquid crystal layer 11 sandwiched between the substrates 12 and 13. The TFT array substrate 12 is made up of thin film transistors (TFTs) 12b and pixel electrodes 12c driven by the TFTs, source bus lines 12d and gate bus lines (not shown) arranged on a transparent substrate 12a. These components are covered by an inner alignment layer 12e as shown. The counterelectrode substrate 13 is made up of a transparent substrate 13a, a transparent electrically conductive layer 13b formed on the transparent substrate 13a and a light-shielding layer 13c formed by electrodeposition coating of the dark-hued coating material. These components are covered by an outer alignment layer 13d. Polarizing plates 14, 15 are mounted on the transparent substrates 12a, 13a, respectively.

It is possible with the method of the present invention to produce a light-shielding layer having high definition and light-shielding capability and low light reflectance easily and with a high accuracy, and may be applied in particular to the preparation of a color filter for a liquid crystal display device or the like having superior properties.

With the present invention, there may also be provided a counterelectrode substrate for a TFT array substrate for black and white display, having a black matrix excellent in definition and light-shielding properties, and a TFT liquid crystal display device for black and white display employing the counterelectrode substrate. The present invention renders it possible to simplify the production process as compared to the conventional photolithographic production process.

EXAMPLES OF THE INVENTION

The present invention is now explained with reference to Examples, Comparative Examples and Application Examples. However, these Examples are given only by way of illustration and are not intended for limiting the invention.

Synthesis Example 1

Preparation of Black-Hued Coating Material (Y-1) and Colored Coating Materials (Y-2, Y-3 and Y-4)

An acrylic resin manufactured by TOA GOSEI CHEMICAL INDUSTRY CO., LTD. under the trade name of "ARON S-4030" was neutralized with triethylamine to pH of approximately 8 and admixed with deionized water to give an aqueous resin solution (S).

To the aqueous resin solution (S), carbon black, azo metal salt red pigment, Phthalocyanine Green and Phthalocyanine Blue were added under agitation to prepare black-hued, red-hued, green-hued and blue-hued liquid pigment dispersions.

By a separate process, the above-mentioned acrylic resin is mixed with a melamine resin manufactured by SUMITOMO CHEMICAL CO., LTD. under the trade name of "SUMIMAL M-66B" and neutralized to pH of approximately 8 with triethylamine. The neutralized mass was then admixed with deionized water to prepare an aqueous resin solution (T).

The aqueous resin solution (T) was added to each of the respective hued pigment dispersions to produce a black-hued coating material (Y-1) and other hued coating materials (Y-2, Y-3 and Y-4) having the compositions shown in Table 1. The resulting coating materials were thermosetting and exhibited anionic electrodeposition properties. The particle size distribution of the resulting coating materials was measured using a light-scattering particle size distribution measurement device manufactured by OTSUKA ELECTRONICS CO., LTD. under the trade name of "PAR-III". The results are shown in Table 2.

TABLE 1

| Coating No. Color | Y-1 Black | Y-2 Red | Y-3 Green | Y-4 Blue |
|---|---|---|---|---|
| Acrylic resin (*1) | 750.0 | 750.0 | 750.0 | 750.0 |
| Melamine Resin (*2) | 250.0 | 250.0 | 250.0 | 250.0 |
| Triethylamine | 61.8 | 61.8 | 61.8 | 61.8 |
| Carbon black | 333.3 | — | — | — |
| Phthalocyanine Blue (*3) | — | — | — | 300.0 |
| Phthalocyanine Green (*4) | — | — | 500.0 | — |
| Azo metal salt red pigment (*5) | — | 500.0 | — | — |

(*1) "ARON S-4030" (mfd. by TOAGOSE CHEMICAL INDUSTRY CO., LTD.)
(*2) "SUMIMAL M66B" (mfd. by SUMITOMO CHEMICAL CO., LTD.)
(*3) "SR-150C" (mfd. by SANYO SHIKISO KK)
(*4) "SAX" (mfd> by SANYO SHIKISO KK)
(*5) "PIGMENT RED 4BS" (mfd. by SANYO SHIKISO KK)
Unit is grm.

TABLE 2

| Coating No. Color | Y-1 Black | Y-2 Red | Y-3 Green | Y-4 Blue |
|---|---|---|---|---|
| Particle siz (μm) | | | | |
| Median size | 0.165 | 0.171 | 0.176 | 0.158 |
| Maximum particle size | 0.34 | 0.39 | 0.39 | 0.39 |

Synthesis Example 2

Preparation of Dark-Hued Coating Materials (Y-5, Y,6 and Y-7)

In the aqueous resin solution (S) prepared by the Synthesis Example 1, fine powders of carbon black, antimony-containing tin oxide manufactured by CATALYSTS & CHEMICALS INDUSTRIES CO., LTD. under the trade name of "ELECOM TL-90", black-hued titanium oxide, manufactured by ISHIHARA SANGYO KAISHA, LTD. under the trade name of "S-1" and nickel manufactured by SUMITOMO METAL MINING CO., LTD. under the trade name of "ENP-005" were dispersed in pre-set amounts to prepare dark-hued coating materials.

The aqueous resin solution (T) prepared in Synthesis Example 1 was added to each of the dark-hued coating material to give respective hued coating materials shown in Table 3. The coating materials thus produced were thermosetting and exhibited anionic electrodeposition properties.

TABLE 3

| Coating No. | Y-5 | Y-6 | Y-7 |
|---|---|---|---|
| Acrylic resin | 750.0 | 750.0 | 750.0 |
| Melamine resin | 250.0 | 250.0 | 250.0 |
| Triethylamine | 61.8 | 61.8 | 61.8 |
| Carbon black | 300.0 | 300.0 | 300.0 |
| Sb-containing SnO$_2$ | 33.3 | — | — |
| Black titanium oxide | — | 33.3 | — |
| Nickel | — | — | 33.3 |

Unit is gram.

Example 1

On a "CORNING 7059" glass (trade name) available from CORNING JAPAN KK, 1.1 mm thick, having an indium tin oxide (ITO) film, 100 nm thick, on its surface, referred to hereinafter as a master plate 1, a positive photoresist composed of a naphthoquinone diazido compound and a novolak cresol resin manufactured by TOKYO OHKA KOGYO CO., LTD. under the trade name of "OFPR-800", was applied by a spin-coating method to have a dry film thickness of 3 μm. The resulting product was irradiated by the light from an ultra-high pressure mercury lamp having a pre-set light-shielding pattern at 70 mJ/cm$^2$ After development with a 2.4 wt % aqueous solution of tetramethyl ammonium hydroxide, the positive photoresist at the exposed portion was selectively removed to lay an ITO film surface thereat to the outside. After washing with water and drying, a dc voltage of 25 V was applied at 25° C. for 60 seconds across the master plate 1 as an anode and a stainless steel beaker containing the black-hued coating material (Y-1) exhibiting anionic electrodeposition properties as a cathode, to perform electrodeposition. The master plate 1 was hoisted from the stainless steel beaker, washed with ion-exchanged water and dried at 70° C. for five minutes.

After heating at 120° C. for 10 minutes, the entire surface of the master plate 1 was then irradiated with the light of the above-mentioned ultra-high pressure mercury lamp at 100 mJ/cm² The master plate 1 was developed with a 2.4 wt % aqueous solution of tetramethyl ammonium hydroxide. It was seen that no change was noticed in the black-hued electrodeposited layer and any residual positive photoresist was removed in its entirety. After washing with water and drying, the master plate 1 having the high-precision light-shielding layer having a film thickness of 2 μm was produced.

The surface resistivity of the coating film, as measured with a four-terminal method, using a surface resistance meter manufactured by MITSUBISHI PETROCHEMICAL CO., LTD. under the trade name of "LORESTA", was $6 \times 10^6$ ohm/□. The volume resistivity of the coating film, as measured using an impedance analyzer manufactured by OTSUKA ELECTRONICS CO., LTD., was $2 \times 10^8$ ohm·cm. The optical density of the coating film, as measured with a densitometer manufactured by KONICA CO. under the trade name of "KONICA DENSITOMETER PDA-65", was 3.30.

Example 2

The manufacture process of Example 1 was followed to form a high precision light-shielding layer followed by heating at 240° C for 60 minutes to prepare a master plate having a light-shielding layer having a film thickness of 2.0 μm. The surface resistivity, the volume resistivity and the optical density of the light-shielding layer were $1 \times 10^2$ ohm/μ, $1 \times 10^3$ ohm·cm and 3.3, respectively.

Example 3

The manufacture process of Example 2 was followed except that heating was performed at 180° C. for 10 minutes to prepare a master plate having a light-shielding layer having a film thickness of 2.0 μm. The surface resistivity, the volume resistivity and the optical density of the light-shielding layer were $2 \times 10^3$ ohm/□, $1 \times 10^4$ ohm·cm and 3.30, respectively.

Application Example 1

Using a master plate having a light-shielding layer, obtained in Example 1, referred to hereinafter as the master plate 1, a color filter by the electrodeposition method as described hereinbelow was prepared.

A positive photoresist manufactured by TOKYO OHKA KOGYO CO., LTD. under the trade name of "OFPR-800" was applied by the spin coating method on the master plate 1 to give a dry film thickness of 3 μm. Then, using a photomask having a mosaic-shaped pattern in which the light exposure portions were larger vertically and horizontally by 10 μm than the gap between the light-shielding layers, light exposure and development were performed, for removing the portions exposed to light to thereby lay the ITO film thereat to the outside. Then, a dc voltage of 25 V was applied at 25° C. for 60 seconds across the master plate 1 as an anode and a stainless steel beaker containing the red-hued coating material (Y-2) exhibiting anionic electrodeposition properties as a cathode to perform the electrodeposition. The master plate 1 was hoisted from the stainless steel beaker, washed with ion-exchanged water and dried. The resulting master plate was then heat-treated at 120° C. for ten minutes to give a red-hued mosaic-shaped layer. Another mosaic-shaped layer neighboring the thus prepared mosaic-shaped layer was exposed to light and developed. The green-hued coating material (Y-3) was electrodeposited and heat-treated in the same way as for the red-hued coating material (Y-2). The operation was repeated for the blue-hued coating material (Y-4) for preparing a color filter. During the above-mentioned electrodeposition steps, the phenomenon of over-coating of the colored coating material on the light-shielding layer was not noticed. The developing liquid employed was a 1 wt % aqueous solution of sodium hydroxide containing 5 wt % of a surfactant manufactured by KAO CO., LTD. under the trade name of "PEREX NBL". For complete curing, the color filter was treated at 180° C. for 30 minutes to give a color filter having a black-hued light-shielding layer exhibiting high accuracy and superior transparency, uniformity and planarity.

Application Example 2

Using the master plate 1 having the light-shielding layer produced by the Example 1, a color filter was prepared in accordance with the pigment dispersion method as described hereinbelow.

Using a color mosaic system, manufactured by FUJI HUNT ELECTRONICS TECHNOLOGY KK under the trade name of "CR-2000", "CG-2000" and "CB-2000", red, green and blue hues were charged in the gaps between the light-shielding layers, in accordance with the processing method as designated by these systems for producing a color filter having excellent planarity. The photomask employed for light exposure had the light-transmitting portions equally dimensioned to the gaps between the light-shielding layers.

Example 4

Using a master plate having a light-shielding layer, obtained in Example 2, referred to hereinafter as a master plate 2, a TFT liquid crystal display device for black and white display was prepared. A display device having superior viewability was obtained.

Reference Example 1

A color filter was prepared in the same way as for the Example 4, using a master plate 2 having a light-shielding layer obtained in Example 2. While the red, green and blue hues were electrodeposited in the light-shielding layers, a color filter having only poor planarity could be obtained.

Comparative Example 1

Using the master plate 1 having the light-shielding layer prepared by the Example 1, a TFT liquid crystal display device for black and white display was prepared. The display device thus prepared was inferior in viewability.

Examples 5 to 7

A positive photoresist "OFPR-800" was coated by the spin coating method on each "CORNING 7059" glass employed in Example 1 (the master plate 1) to have a dry film thickness of 3 μm. Each of the master plates 1 was irradiated with light from an ultra-high pressure mercury lamp via a mask having a pre-set light-shielding pattern. After development with a 2.4 wt % aqueous solution of tetramethyl ammonium hydroxide, the positive photoresist was selectively removed at the exposed portion for laying the ITO film surface thereat to the outside. Then, a dc voltage of 25 V was applied at 25° C. for 60 seconds across each master plate 1 as an anode and each stainless steel beaker containing each of the black-hued coating materials (Y-5, Y-6 and Y-7) exhibiting anionic electrodeposition properties as a cathode, to perform the electrodeposition. Each master plate 1 was hoisted from the stainless steel beaker, washed with ion-exchanged water and dried at 70° C. for five minutes.

The entire surface of each master plate 1 was then irradiated with light of the above-mentioned ultra-high pressure mercury lamp at 100 mJ/cm$^2$. After heating at 120° C. for 10 minutes, each master plate was developed with a 2.4 wt % aqueous solution of tetramethyl ammonium hydroxide. It was seen that no changes were noticed in the black-hued electrodeposited layers and any residual positive photoresist was removed in its entirety. After washing with water and drying, each master plate having the high-precision light-shielding layer having a film thickness of 2 μm was produced.

After drying, each master plate was cured by heating at 140° C. for 60 minutes to give a counterelectrode substrate for a TFT array substrate for black and white display. The surface resistivity, volume resistivity and OD values of the coating films obtained in this manner, are shown in Table 4.

TABLE 4

| Example<br>Coating No. | 5<br>Y-5 | 6<br>Y-6 | 7<br>Y-7 |
| --- | --- | --- | --- |
| Surface resistivity (Ω/□) | $1 \times 10^2$ | $1 \times 10^2$ | $1 \times 10^2$ |
| Volume resistivity (Ω · cm) | $2 \times 10^2$ | $2 \times 10^2$ | $2 \times 10^2$ |
| O D value | 8.0 | 8.0 | 8.1 |

Comparative Example 2

In a similar manner to Synthesis Example 1, a black-hued electrodeposition coating material (Y-8) composed of 750.0 g of the acrylic resin, 250.0 g of the melamine resin, 61.8 g of triethylamine, 30.0 g of Phthalocyanine Blue, 50.0 g of Phthalocyanine Green and 50.0 g of azo metal salt red pigment was prepared. Using this coating material, a glass substrate having a black-hued coating film having a film thickness of 2 μm was prepared in a manner similar to Example 1. The surface resistivity and the volume resistivity of the coating film were measured and found to be $5 \times 10^{14}$ ohm/□ and $2 \times 10^{13}$ ohm·cm, respectively. Using this glass plate, a color filter was prepared in a manner similar to Application Example 1. The optical density of the light-shielding layer of this color filter was 1.10. With this optical density, the color filter could not be practically employed because its characteristics, such as contrast, was extremely low.

Comparative Example 3

In a similar manner to Synthesis Example 2, a black-hued coating material for electrodeposition (Y-9), composed of 750.0 g of the acrylic resin, 250.0 g of the melamine resin, 61.8 g of triethylamine and 1,000 g of nickel was prepared. Using this coating material, a glass substrate having a black-hued coating film having a film thickness of 2 μm was prepared in a manner similar to Example 1. The surface resistivity and the volume resistivity of the coating film were measured and found to be 50 ohm/□ and 40 ohm·cm, respectively. Using this glass substrate, a TFT liquid crystal display device for black and white display was prepared.

The display device had the light-shielding layer of extremely low accuracy because of its poor adhesivity.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A method for preparing a substrate having a light-shielding layer for use as a counterelectrode substrate for a thin film transistor array substrate for black and white display, said method comprising the steps of:

i) forming a positive photosensitive coating film on a transparent electrically conductive layer formed on a transparent substrate, ii) exposing said positive photosensitive coating film via a mask exhibiting light transmitting properties only at portions thereof registering with the light-shielding layer, iii) removing and developing the portions of the coating film exposed to light for exposing the transparent electrically conductive layer and electrodepositing a dark-hued coating on at least a portion of the exposed transparent electrically conductive layer for forming the light shielding layer, and iv) heating said light-shielding layer, said light-shielding layer having a volume resistivity of $1 \times 10^2$ to $1 \times 10^6$ ohm·cm.

2. A method for preparing a substrate having a light-shielding layer for use as a counterelectrode substrate for a thin film transistor array substrate for black and white display, said method comprising the steps of:

i) forming a negative photosensitive coating film on a transparent electrically conductive layer formed on a transparent substrate, ii) exposing said negative photosensitive coating film via a mask exhibiting light transmitting properties only at portions thereof other than those registering with the light-shielding layer, iii) removing and developing the portions of the coating film not exposed to light for exposing the transparent electrically conductive layer and electrodepositing a dark-hued coating on at least the exposed transparent electrically conductive layer for forming the light shielding layer, and iv) heating said light-shielding layer, said light-shielding layer having a volume resistivity of $1 \times 10^2$ to $1 \times 10^6$ ohm·cm.

3. A method for preparing a substrate having a light-shielding layer for a color filter of a liquid crystal display device comprising the steps of:

i) forming a positive photosensitive coating film on a transparent electrically conductive layer formed on a transparent substrate, ii) exposing said positive photosensitive coating film via a mask exhibiting light transmitting properties only at portions thereof registering with the light-shielding layer, iii) removing and developing the portions of the coating film exposed to light for exposing the transparent electrically conductive layer and electrodepositing a dark-hued coating on at least a portion of the exposed transparent electrically conductive layer for forming the light shielding layer, and iv) heating said light-shielding layer, said light-shielding layer having a volume resistivity of $1\times10^6$ to $1\times10^{12}$ ohm·cm.

4. A method for preparing a substrate having a light-shielding layer for a color filter of a liquid crystal display device comprising the steps of:

i) forming a negative photosensitive coating film on a transparent electrically conductive layer formed on a transparent substrate, ii) exposing said negative photosensitive coating film via a mask exhibiting light transmitting properties only at portions thereof other than those registering with the light-shielding layer, iii) removing and developing the portions of the coating film not exposed to light for exposing the transparent electrically conductive layer and electrodepositing a dark-hued coating on at least the exposed transparent electrically conductive layer for forming the light shielding layer, and iv) heating said light-shielding layer, said light-shielding layer having a volume resistivity of $1\times10^6$ to $1\times10^{12}$ ohm·cm.

5. The method as claimed in claim 1 or 3 wherein said transparent substrate is selected from the group consisting of quartz, glasses, polyester, polyphenylene sulfide, epoxy resin, acrylic resin, polymethylpentene, polyimides, polycarbonates, polyamides, polysulfones, polyether, polystyrene, acrylonitrile-styrene copolymers, cellulose triacetate and mixtures thereof.

6. The method as claimed in claim 1 or 3 wherein said transparent electrically conductive layer is formed of a material selected from the group consisting of tin oxide, indium oxide, indium-tin oxide and antimony oxide.

7. The method as claimed in claim 1 or 3 wherein said positive coating film is selected from the group consisting of compounds containing quinone diazido groups, compounds having diazomeldrum's acid, compounds having nitrobenzyl esters and a composition containing at least one of said compounds.

8. The method as claimed in claim 2 or 4 wherein said negative photosensitive coating film contains a material selected from the group consisting of a resin and a prepolymer each having an ethylenic double bond capable of cross-linking by light, a coloring agent selected from the group consisting of a dye, a pigment and mixtures thereof, and a photopolymerization initiator.

9. The method as claimed in claim 2 or 4 wherein said negative photosensitive coating film further contains a low molecular (meth)acrylate.

10. The method as claimed in claim 8 wherein said photopolymerization initiator is selected from the group consisting of benzoins, benzoin ethers, benzyl alkyl ketals, benzophenones, anthraquinones, thioxanthones and mixtures thereof.

11. The method as claimed in claim 1 or 3 wherein said dark-hued coating contains a coloring agent selected from the group consisting of carbon black, graphite, vanadium trioxide, manganese dioxide, molybdenum disulfide, triiron tetraoxide, Aniline Black, Sudan Black B, Acid Black 1 and 52, Fast Black K Salt, Nigrosin and mixtures thereof.

12. The method as claimed in claim 2 or 4 wherein said transparent substrate is selected from the group consisting of quartz, glasses, polyester, polyphenylene sulfide, epoxy resin, acrylic resin, polymethylpentene, polymides, polycarbonates, polyamides, polysulfones, polyether, polystyrene, acrylonitrile styrene copolymers, cellulose triacetate and mixtures thereof.

13. The method as claimed in claim 2 or 4 wherein said transparent electrically conductive layer is formed of a material selected from the group consisting of tin oxide, indium oxide, indium-tin oxide and antimony oxide.

14. The method as claimed in claim 2 or 4 wherein said dark-hued coating contains a coloring agent selected from the group consisting of carbon black, graphite, vanadium trioxide, manganese dioxide, molybdenum disulfide, triiron tetraoxides Aniline Black, Sudan Black B, Acid Black 1 and 52, Fast Black K Salt, Nigrosin and mixtures thereof.

* * * * *

UNITED STATES PATENT AND TRADEMARK OFFICE
CERTIFICATE OF CORRECTION

PATENT NO. : 5,527,649
DATED : June 18, 1996
INVENTOR(S) : Haruyoshi Sato, et. al.

It is certified that error appears in the above-identified patent and that said Letters Patent is hereby corrected as shown below:

Title page, item [73], Assignee: should read -- Nippon Oil Co., Dai Nippon Printing Co., Ltd., both of Tokyo, Japan--

Signed and Sealed this

Fifth Day of November, 1996

*Attest:*

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,527,649
DATED : June 18, 1996
INVENTOR(S) : Haruyoshi SATO et al.

It is certified that error appears in the above-indentified patent and that said Letters Patent is hereby corrected as shown below:

Title page, Item [73], Assignee: should read --Nippon Oil Co., Ltd., and Dai Nippon Printing Co., Ltd., both of Tokyo, Japan--.

This certificate supersedes Certificate of Correction issued November 5, 1996.

Signed and Sealed this

Seventeenth Day of June, 1997

Attest:

BRUCE LEHMAN

Attesting Officer

Commissioner of Patents and Trademarks